(12) United States Patent
Fu et al.

(10) Patent No.: US 6,462,959 B1
(45) Date of Patent: Oct. 8, 2002

(54) INTERFACE CARD AND INTERFACE CARDHOLDER MOUNTING ARRANGEMENT

(75) Inventors: Chun-Yu Fu, Taoyuan Hsien (TW); Lin-Sung Peng, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 0 days.

(21) Appl. No.: 10/028,492

(22) Filed: Dec. 28, 2001

(51) Int. Cl.⁷ .............................. H05K 7/14; H05K 7/18
(52) U.S. Cl. ...................... 361/801; 361/759; 361/796; 361/798; 361/802; 361/825; 361/829; 211/41.17; 220/4.02; 248/200; 248/222.52; 248/223.31; 248/225.11; 248/225.21
(58) Field of Search .................... 361/752, 753, 361/759, 796, 798, 801, 802, 825, 829; 211/41.17; 220/4.02; 248/200, 222.52, 223.31, 225.11, 225.21

(56) References Cited

U.S. PATENT DOCUMENTS

| | | | |
|---|---|---|---|
| 5,004,867 A | * | 4/1991 | Mast ...................... 174/35 GC |
| 5,601,349 A | * | 2/1997 | Holt ............................ 174/67 |
| 5,757,618 A | * | 5/1998 | Lee ............................ 361/686 |
| 5,957,465 A | * | 9/1999 | Gonsalves et al. ...... 174/17 CT |
| 6,058,025 A | * | 5/2000 | Ecker et al. .............. 174/35 R |
| 6,169,662 B1 | * | 1/2001 | Clark et al. ................. 206/706 |
| 6,359,788 B1 | * | 3/2002 | Giese et al. ................ 361/756 |
| 6,396,690 B1 | * | 5/2002 | Blatti ....................... 211/41.17 |

* cited by examiner

*Primary Examiner*—David Martin
*Assistant Examiner*—Thanh Y. Tran
(74) *Attorney, Agent, or Firm*—Troxell Law Office PLLC

(57) ABSTRACT

An interface card and interface cardholder mounting arrangement in which the interface cardholder has parallel tracks for holding interface cards, each track having a springy retaining strip, a positioning pressure strip disposed in parallel to the springy retaining strip and defining with the springy retaining strip a sliding groove for the insertion of one interface card, a stop block extended from the free end of the springy retaining strip and disposed at one end of the sliding groove for keeping the inserted interface card in the sliding groove, and an outer protruding finger strip extended from the free end of the springy retaining strip for m pulling by hand to deform the free end of the springy retaining strip and to move the stop block away from the sliding groove for removal of the corresponding interface card from the respective track.

1 Claim, 6 Drawing Sheets

INTERFACE CARD AND INTERFACE CARDHOLDER MOUNTING ARRANGEMENT

BACKGROUND OF THE INVENTION

1. Field of the Invention

The present invention relates computer interface card mounting designs and, more particularly, to an interface card and interface cardholder mounting arrangement, which keeps installed interface cards positively secured in position against vibration.

2. Description of the Related Art

Different interface cards may be installed in the motherboard of a computer to expand the function of the motherboard. Regular interface cards have different lengths. A short interface card can be positively secured in position against vibration when installed in the motherboard. However, a long interface card tends to be vibrated during transportation of the computer. In order to eliminate this problem, interface cardholder means shall be used.

SUMMARY OF THE INVENTION

The present invention has been accomplished under the circumstances in view. It is one object of the present invention to provide an interface cardholder for holding interface cards on a motherboard, which enables interface cards to be easily quickly installed. It is another object of the present invention to provide an interface cardholder for holding interface cards on a motherboard, which keeps installed interface cards positively in position against vibration. It is still another object of the present invention to provide an interface cardholder for holding interface cards on a motherboard, which enables installed interface cards to be conveniently dismounted. To achieve these and other objects of the present invention, the interface cardholder comprises parallel tracks for holding interface cards. Each track comprises a springy retaining strip, a positioning pressure strip disposed in parallel to the springy retaining strip and defining with the springy retaining strip a sliding groove for the insertion of one interface card, a stop block extended from the free end of the springy retaining strip and disposed at one end of the sliding groove for keeping the inserted interface card in the sliding groove, and an outer protruding finger strip extended from the free end of the springy retaining strip for pulling by hand to deform the free end of the springy retaining strip and to move the stop block away from the sliding groove for removal of the corresponding interface card from the respective track.

DETAILED DESCRIPTION OF THE PREFERRED EMBODIMENT

Figure 1:
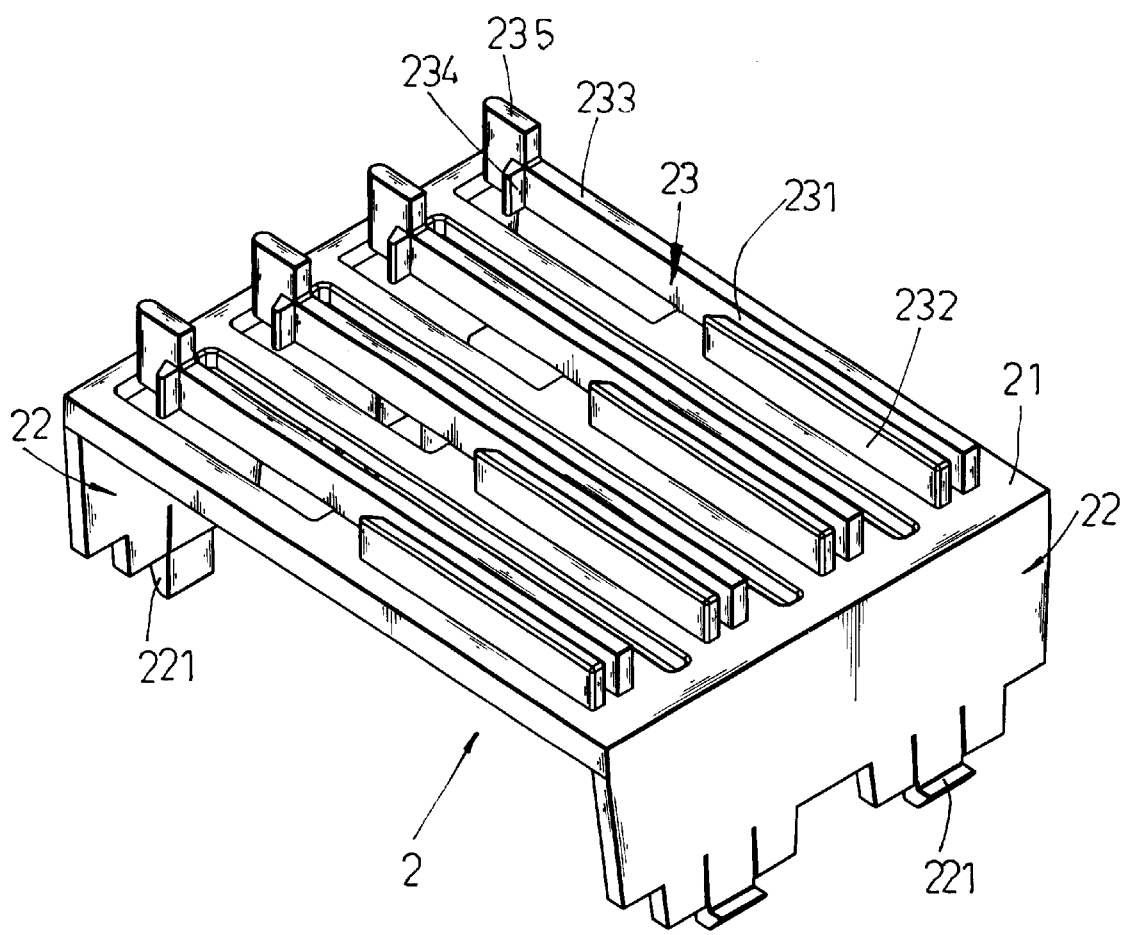
FIG. 1 is an elevational view of an interface cardholder constructed according to the present invention.
Figure 2:
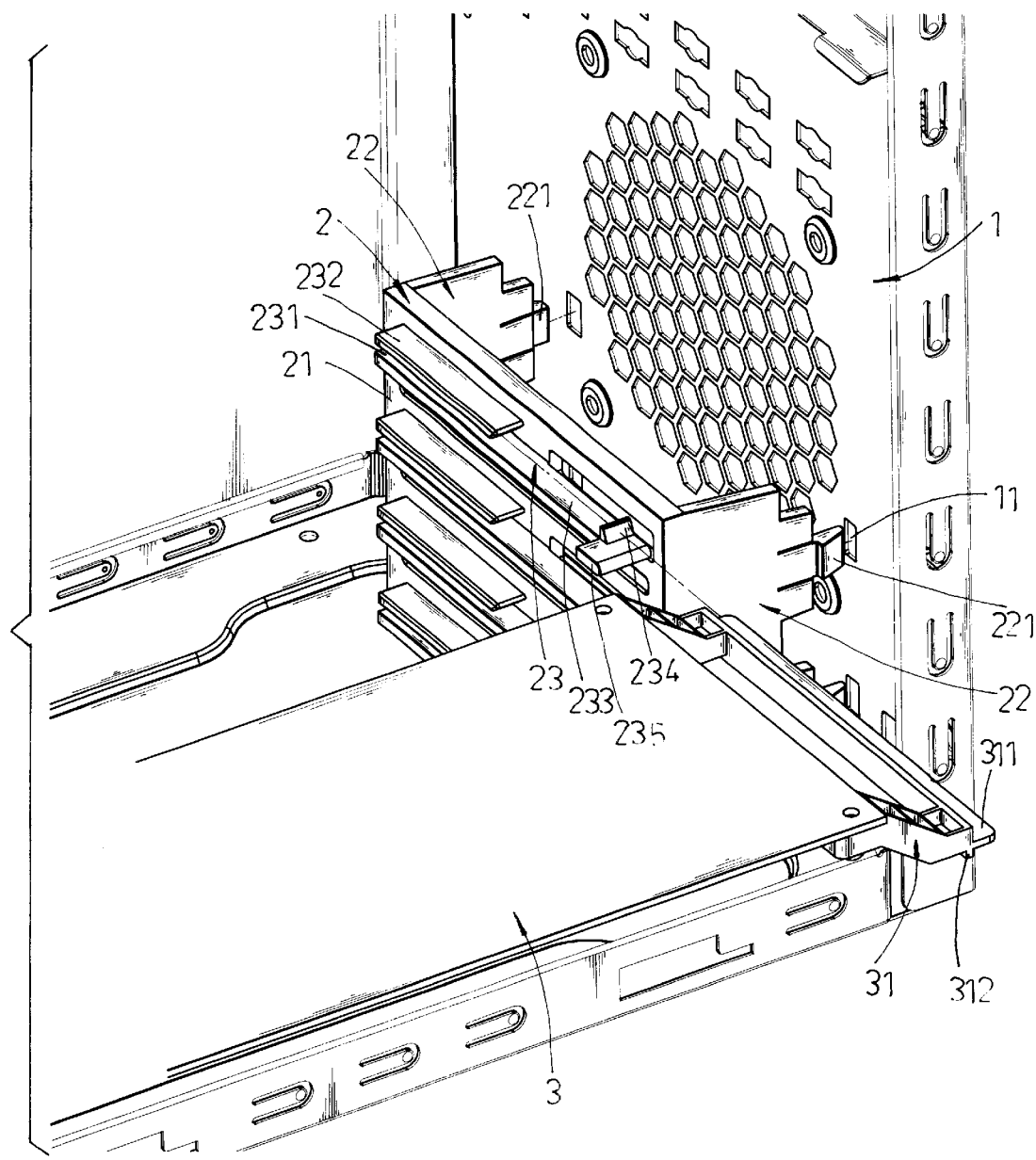
FIG. 2 is a perspective view showing the interface cardholder detached from the housing for computer and the interface card detached from the interface cardholder according to the present invention.
Figure 3:
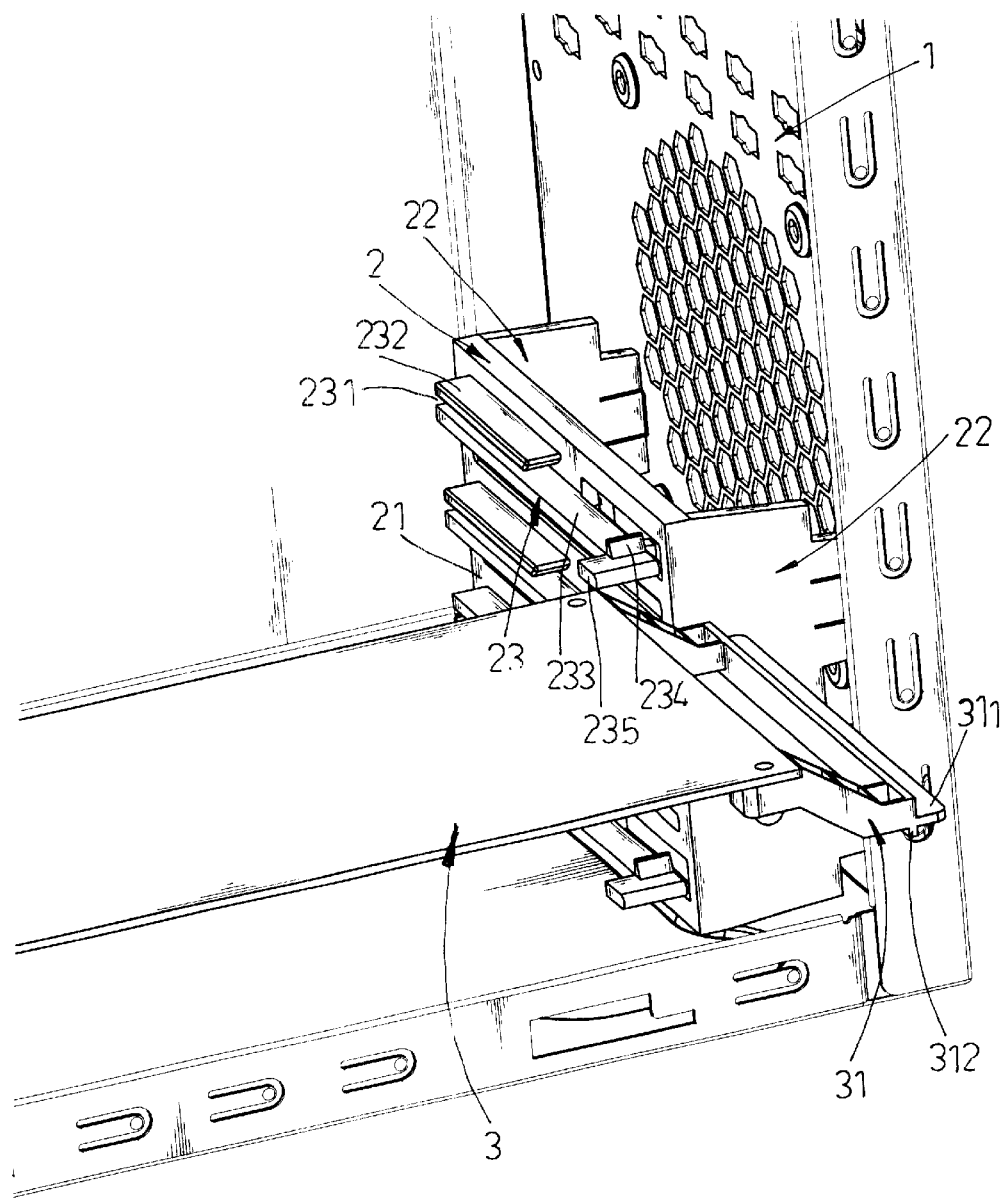
FIG. 3 is an oblique top elevation showing the interface cardholder installed in the housing for computer, the interface card partially inserted into one track of the interface cardholder according to the present invention.
Figure 4:
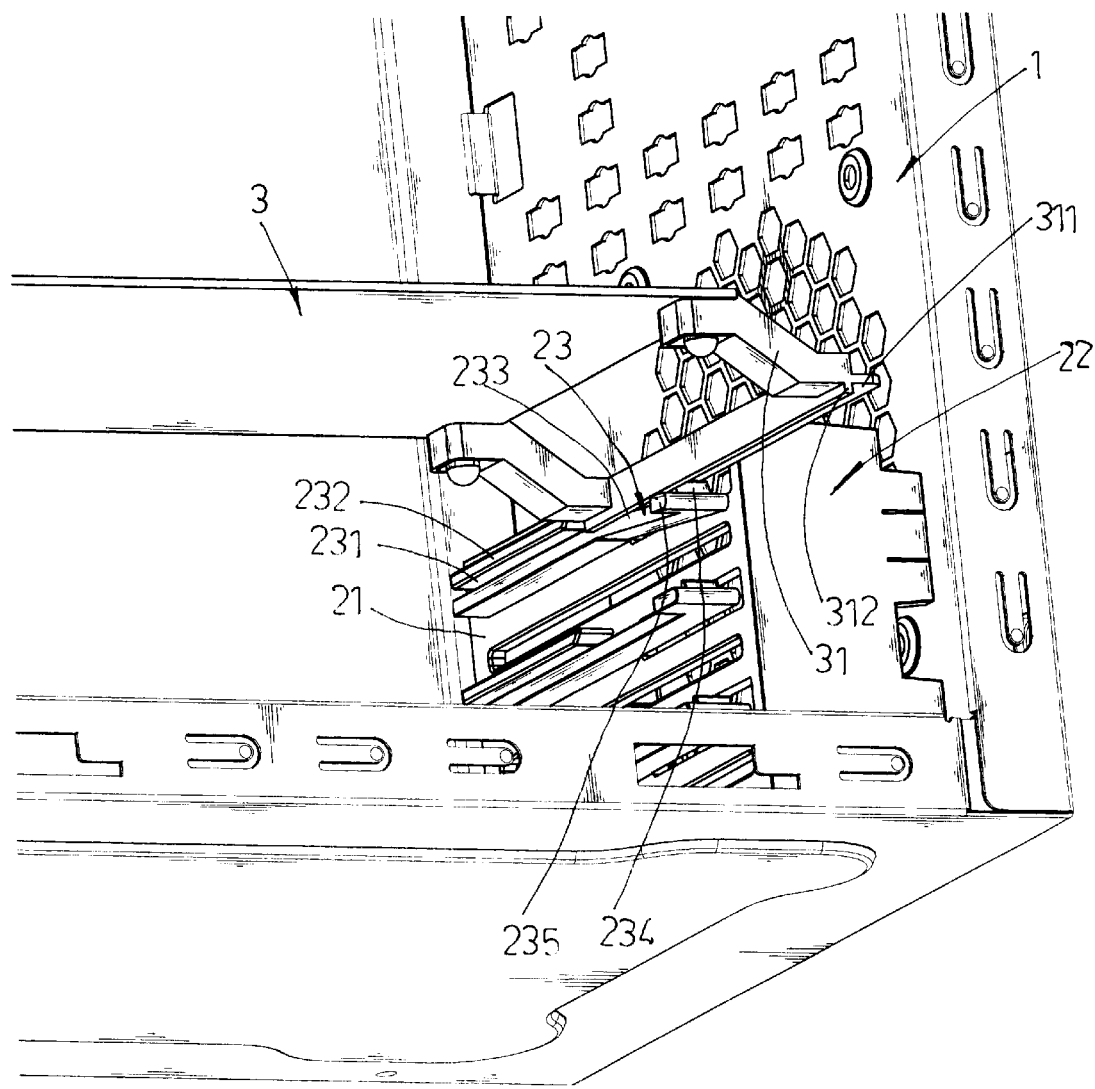
FIG. 4 is an oblique bottom elevation showing the interface cardholder installed in the housing for computer, the interface card partially inserted into one track of the interface cardholder according to the present invention.
Figure 5:
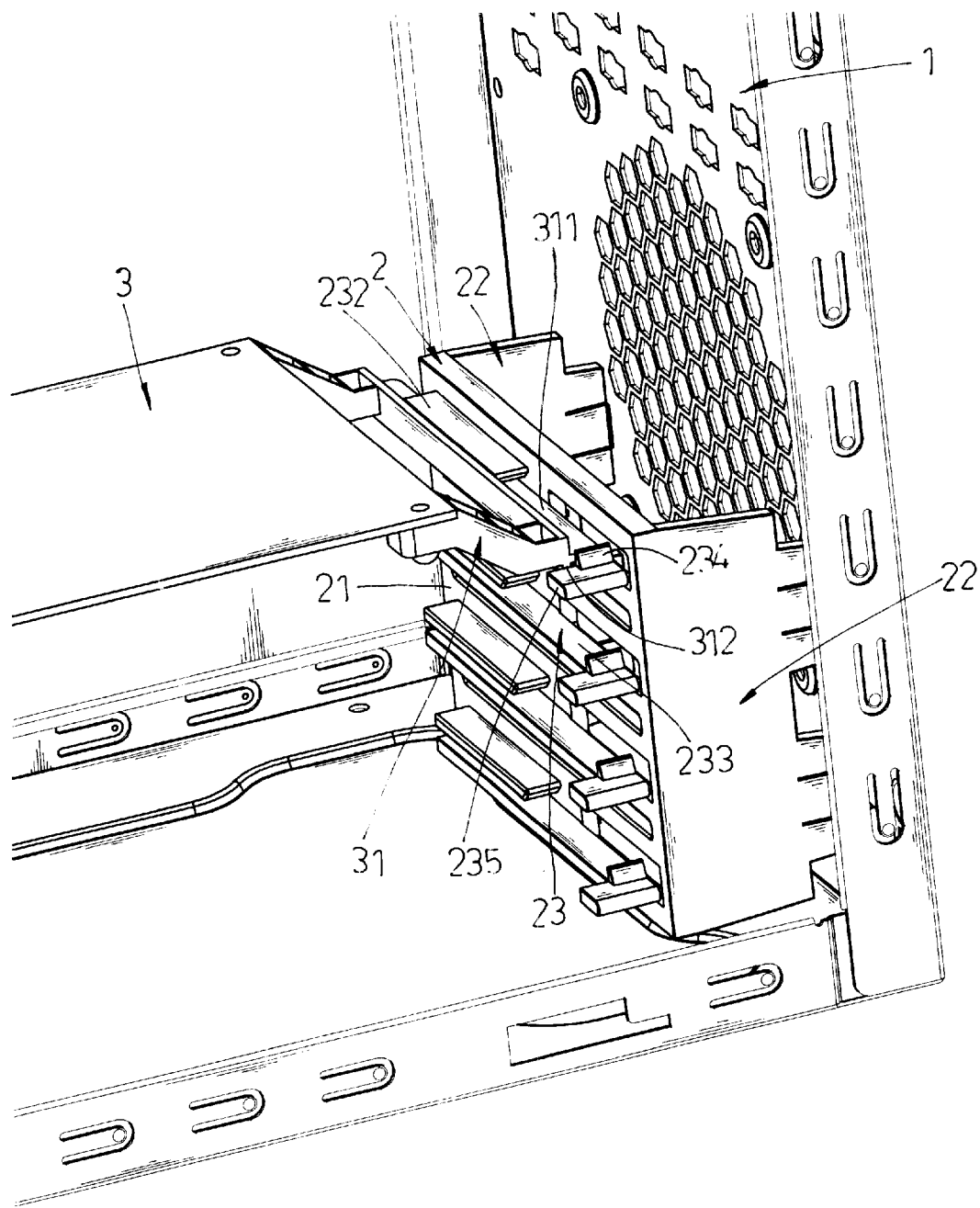
FIG. 5 is an oblique top view showing the interface card set in position in one track of the interface cardholder according to the present invention.
Figure 6:
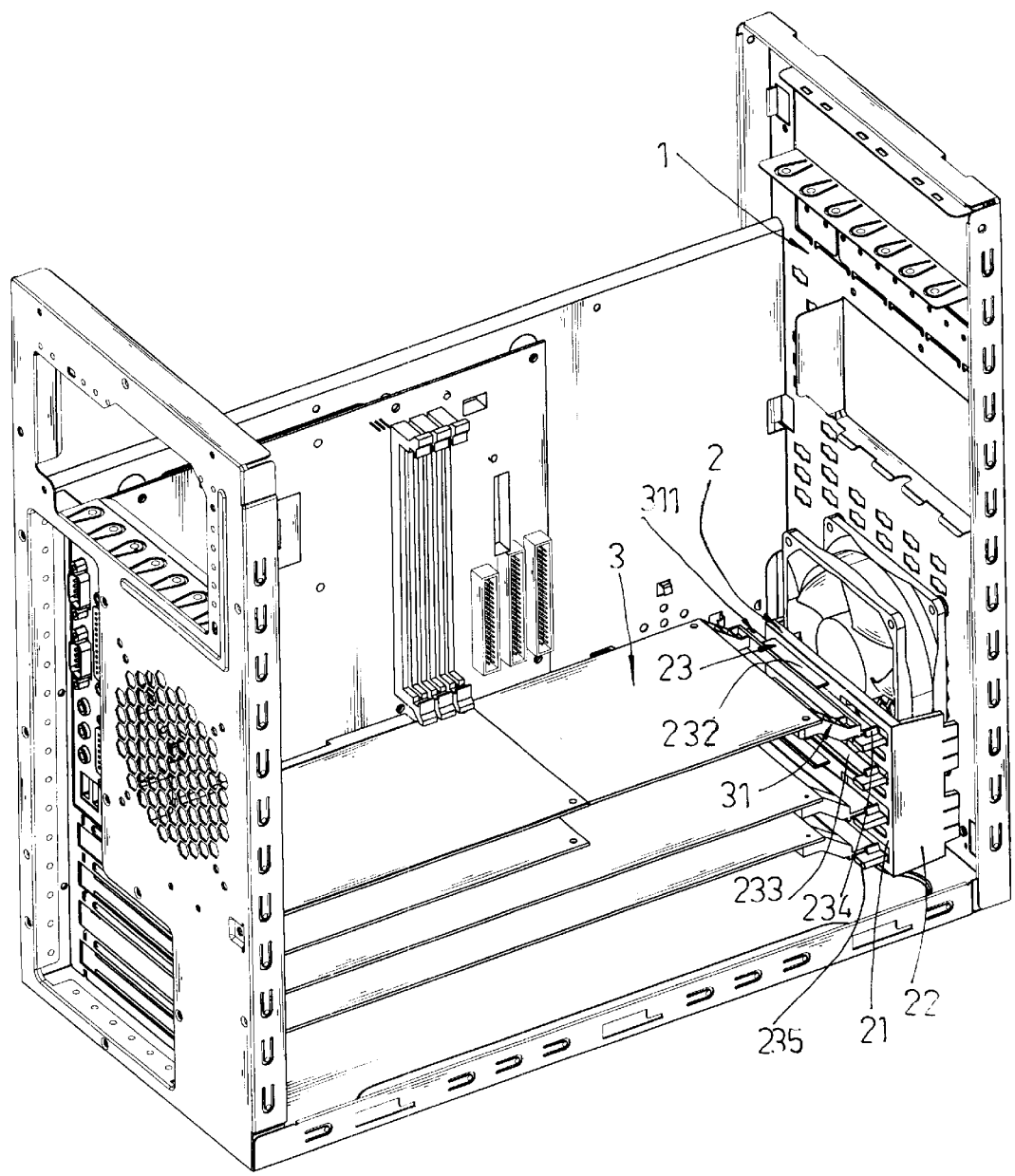
FIG. 6 illustrates a number of interface cards inserted into the interface cardholder and connected to the motherboard in the housing for computer according to the present invention.

Referring to FIGS. 1, 2, and 6, an interface cardholder 2 is installed in a housing for computer 1 for holding interface cards 3, for enabling interface cards 3 to be connected to the motherboard in the housing 1. The housing 1 comprises pairs of mounting holes 11 symmetrically disposed at one side at different elevations. The interface cardholder 2 comprises a holder base 21, two parallel mounting flanges 22 perpendicularly backwardly extended from two sides of the holder base 21, pairs of springy hooks 221 respectively extended from the mounting flanges 22 and respectively hooked in the mounting holes 11, and parallel tracks 23 provided at the holder base 21 for the mounting of interface cards 3. Each track 23 comprises a springy retaining strip 233, a positioning pressure strip 232, a stop block 234, and an outer protruding finger strip 235. The springy retaining strip 233 and the positioning pressure strip 232 are arranged in parallel, defining therebetween a sliding groove 231. The length of the positioning pressure strip 232 is about one half of the springy retaining strip 233. The bottom side of the springy retaining strip 233 has one half fixedly connected to the holder base 21 and the other half suspended from the holder base 21. The stop block 234 and the outer protruding finger strip 235 are formed integral with the free end of the springy retaining strip 233. The outer protruding block 235 has a height greater than the springy retaining strip 233. Further, each interface card 3 has a support frame 31 at one lateral side. The support frame 31 comprises an insertion plate 311 and a stop strip 312 arranged at right angles.

Referring to FIGS. from 3 through 6, when mounting an interface card 3, attach the support frame 31 of the interface card 3 to the holder base 21 of the interface cardholder 2, keeping the insertion plate 311 stopped at the stop block 234 of one track 23, and then force the support frame 31 inwards to engage the insertion plate 311 into the sliding groove 231 between the springy retaining strip 233 and the positioning pressure strip 232 of the selected track 23. When moving the interface card 3 in the sliding groove 231 toward the motherboard, the stop strip 312 is stopped at an outer side of the springy retaining strip 233, for enabling the interface card 3 to be set into the selected track 23. When set into position, the stop block 234 stops the outer end of the support frame 31 in place, preventing the interface card 3 from falling out of the selected track 23. Therefore, the interface card 3 is positively secured in place when the host computer receives a vibration test.

Further, when removing the interface card 3 from the corresponding track 23, press the outer protruding finger strip 235 inwards to deform the free end of the springy retaining strip 233 and to move the interface card 3 outwards from the stop block 234, enabling the interface card 3 to be conveniently taken away from the track 23.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. An interface card and interface cardholder mounting arrangement comprising an interface cardholder fastened to the inside of a computer housing, and a plurality of interface cards respectively mounted in said interface cardholder and connected to a motherboard in said computer housing, wherein:

said interface cardholder comprises a holder base, two parallel mounting flanges perpendicularly backwardly extended from two sides of said holder base, pairs of springy hooks respectively extended from said mounting flanges and respectively hooked in respective mounting holes in said computer housing, and parallel tracks provided at said holder base for the mounting of said interface cards, said tracks each comprising a springy retaining strip, said springy retaining strip having a rear fixed end fixedly connected to said holder base and a front free end spaced from said holder base, a positioning pressure strip disposed in parallel to said springy retaining strip, a sliding groove defined between said springy retaining strip and said positioning pressure strip, a stop block extended from the front free end of said springy retaining strip and disposed at one end of said sliding groove, and an outer protruding finger strip extended from the front free end of said springy retaining strip for pulling by hand to deform the front free end of said springy retaining strip and to move said stop block away from said sliding groove;

said interface cards each comprise a support frame disposed at one lateral side for supporting on one track of said interface card, said support frame comprising an insertion plate adapted for engaging into the sliding groove of one track of said interface cardholder, and a stop strip adapted for stopping at an outer side of the springy retaining strip of one track of said interface card to let said insertion plate be set into the sliding groove of the selected track in said interface cardholder.

\* \* \* \* \*